(12) United States Patent
Steigerwald et al.

(10) Patent No.: US 10,950,542 B2
(45) Date of Patent: Mar. 16, 2021

(54) HIGH-PERFORMANCE VARIABLE GAIN AMPLIFIER EMPLOYING LAMINATE TRANSMISSION LINE STRUCTURES

(71) Applicant: Analog Devices, Inc., Norwood, MA (US)

(72) Inventors: Luke Steigerwald, Westford, MA (US); Marc E. Goldfarb, Atkinson, NH (US); Andrew Pye, Somerville, MA (US); Simon Gay, Medford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 13 days.

(21) Appl. No.: 16/359,450

(22) Filed: Mar. 20, 2019

(65) Prior Publication Data
US 2020/0303302 A1    Sep. 24, 2020

(51) Int. Cl.
| | | |
|---|---|---|
| *H03F 3/187* | (2006.01) | |
| *H01L 23/522* | (2006.01) | |
| *H03H 7/42* | (2006.01) | |
| *H01L 23/64* | (2006.01) | |
| *H03F 3/195* | (2006.01) | |
| *H01L 23/532* | (2006.01) | |
| *H03G 3/30* | (2006.01) | |
| *H01L 23/66* | (2006.01) | |

(52) U.S. Cl.
CPC .... *H01L 23/5227* (2013.01); *H01L 23/53228* (2013.01); *H01L 23/645* (2013.01); *H01L 23/66* (2013.01); *H03F 3/195* (2013.01); *H03G 3/3036* (2013.01); *H03H 7/42* (2013.01)

(58) Field of Classification Search
CPC .................................................... H03F 3/187
USPC ...................................... 330/307, 124 R, 295
See application file for complete search history.

(56) References Cited

U.S. PATENT DOCUMENTS

| | | | |
|---|---|---|---|
| 6,377,464 B1 | 4/2002 | Hashemi et al. | |
| 6,784,744 B2 | 8/2004 | Shi et al. | |
| 6,801,114 B2 | 10/2004 | Yang et al. | |
| 7,138,844 B2 | 11/2006 | Cheung et al. | |
| 7,626,472 B2 | 12/2009 | Davies-Venn et al. | |
| 7,821,335 B2 | 10/2010 | Shiramizu et al. | |
| 8,228,154 B2 | 7/2012 | Liu et al. | |
| 9,413,302 B2 * | 8/2016 | Shi ........................ | H03F 1/3247 |

(Continued)

OTHER PUBLICATIONS

Bakalski et al., *A fully integrated 5.3 GHz, 2.4V, 0.3 W SiGe-Bipolar Power Amplifier with 50 Ω output*, 0-7803-8108-4/03 © 2003 IEEE, 4 pages.

(Continued)

*Primary Examiner* — Henry Choe
(74) *Attorney, Agent, or Firm* — Patent Capital Group

(57) ABSTRACT

One embodiment is an apparatus comprising a semiconductor integrated circuit ("IC") chip comprising at least one active component for implementing an amplifier circuit; and a laminate structure comprising a plurality of metal layers, the laminate structure further comprising a plurality of passive components and transmission line-based structures. The semiconductor IC chip is integrated with the laminate structure such that a top layer of the laminate structure comprises a shield over a top of the semiconductor IC chip and the passive components for limiting electromagnetic coupling of signals generated by the amplifier circuit beyond the laminate structure.

19 Claims, 9 Drawing Sheets

(56) References Cited

U.S. PATENT DOCUMENTS

| | | |
|---|---|---|
| 9,634,614 B2* | 4/2017 | Mu .......................... H03F 1/18 |
| 10,665,556 B2* | 5/2020 | Wu .......................... H01L 24/13 |
| 2015/0171878 A1 | 6/2015 | Schafferer et al. |
| 2020/0066677 A1* | 2/2020 | Bhagavat ................ G06F 1/189 |
| 2020/0091608 A1 | 3/2020 | Alpman et al. |

OTHER PUBLICATIONS

Bakalski, *Integrated 2.45 GHz Power Amplifier*, Friedberg, Sep. 2001, 56 pages.

Murphy et al., *Use of Integrated Passives in Micromodule SIPs*, Analog Dialogue 52-10, Oct. 2018, 3 pages.

Beles, *900 MHz Power Amplifier Module in Multilayer-Laminate Technology*, Ganserndorf, Jun. 2005, 60 pages.

\* cited by examiner

HIGH-PERFORMANCE VARIABLE GAIN AMPLIFIER EMPLOYING LAMINATE TRANSMISSION LINE STRUCTURES

FIELD OF THE DISCLOSURE

This disclosure relates generally to the field of variable gain amplifiers ("VGAs") and, more particularly, to techniques for implementing a high-performance VGA employing laminate transmission line structures.

BACKGROUND

A variable gain amplification ("VGA") may be used to create a larger or smaller signal at an output thereof for the purpose of driving a power amplifier. In particular, the VGA may be designed to provide an interface between a radio frequency digital-to-analog converter ("RF-DAC") and a power amplifier to provide amplification as well as power control over octave bandwidths.

SUMMARY OF THE DISCLOSURE

One embodiment is an apparatus comprising a semiconductor integrated circuit ("IC") chip comprising at least one active component for implementing an amplifier circuit; and a laminate structure comprising a plurality of metal layers, the laminate structure further comprising a plurality of passive components and transmission line-based structures. The semiconductor IC chip is integrated with the laminate structure such that a top layer of the laminate structure comprises a shield over a top of the semiconductor IC chip and the passive components for limiting electromagnetic coupling of signals generated by the amplifier circuit beyond the laminate structure. In certain embodiments, the top metal layer comprises copper, the at least one active component comprises at least one of an operational amplifier, a digital attenuator ("DSA"), and an analog attenuator ("VVA"), and the plurality of passive components comprises a balun connected to receive an output of a radio frequency digital-to-analog converter ("RF-DAC"). The balun may comprise a transmission line balun and the plurality of passive components may comprise at least one quadrature hybrid connected between an output of the balun and an input of the semiconductor IC chip and at least one quadrature hybrid connected between an output of the semiconductor IC chip and an input of a power amplifier.

In certain embodiments, the apparatus may include a plurality of ground vias disposed around a periphery of the laminate structure from a top layer thereof to a bottom layer thereof for limiting electromagnetic coupling of signals produced by the amplifier circuit and a ground rail comprising a stack of metal layers connected to ground through the apparatus to a printed circuit board ("PCB") to which the apparatus is connected for further limiting electromagnetic coupling of signals produced by the amplifier circuit with signals produced by another amplifier circuit proximate the first amplifier circuit. The metal layers comprising the ground rail may be identical to the metal layers comprising the laminate structure. Additionally, the semiconductor IC chip may be a silicon germanium ("SiGe") chip and may include copper pillars for enabling low inductance grounds.

An alternative embodiment is a dual-channel amplification apparatus comprising: a first semiconductor integrated circuit ("IC") chip comprising at least one first active component for implementing a first amplifier circuit associated with a first channel; a second semiconductor IC chip comprising at least one second active component for implementing a second amplifier circuit associated with a second channel; a first metal laminate structure comprising a first plurality of passive components and transmission line based structures; and a second metal laminate structure arranged parallel to the first metal laminate structure, the second metal laminate structure comprising a second plurality of passive components and transmission line-based structures. In certain embodiments, the first semiconductor IC chip is integrated with the first laminate structure such that a top layer of the first laminate structure comprises a first shield over a top of the first semiconductor IC chip and the first passive components for limiting electromagnetic coupling of signals comprising the first channel with signals comprising the second channel and the second semiconductor IC chip is integrated with the second laminate structure such that a top layer of the second laminate structure comprises a shield over a top of the second semiconductor IC chip and the second passive components for limiting electromagnetic coupling of signals comprising the second channel with signals comprising the first channel.

The top metal layer of the first and second laminate structures may be copper. The apparatus may further include a first plurality of ground vias disposed around a periphery of the first laminate structure from a top layer thereof to a bottom layer thereof and a second plurality of ground vias disposed around a periphery of the second laminate structure from a top layer thereof to a bottom layer thereof, the first and second plurality of ground vias for isolating the first channel from the second channel. Still further, the apparatus may include a ground rail disposed between the first metal laminate structure and the second metal laminate structure, the ground rail comprising a stack of metal layers connected to ground for further limiting electromagnetic coupling of signals associated with the first channel and signals associated with the second channel. In certain embodiments, the metal layers comprising the ground rail are identical to the metal layers comprising the laminate structure.

Yet another embodiment is a variable gain amplifier ("VGA") circuit comprising a semiconductor integrated circuit ("IC") chip comprising at least one active component for implementing an amplifier circuit; and a laminate structure comprising a plurality of metal layers, the laminate structure further comprising a plurality of passive components and transmission line-based structures. The semiconductor IC chip is integrated with the laminate structure such that a top layer of the laminate structure comprises a shield over a top of the semiconductor IC chip and the passive components for limiting electromagnetic coupling of signals generated by the amplifier circuit beyond the laminate structure. Additionally, the VGA circuit comprises an input for receiving an output of a digital-to-analog converter ("DAC") and an output connected to an input of a power amplifier.

The VGA circuit may further include a plurality of ground vias disposed around a periphery of the laminate structure from a top layer thereof to a bottom layer thereof for limiting electromagnetic coupling of signals produced by the amplifier circuit. Additionally, the VGA circuit may include a ground rail comprising a stack of metal layers connected to ground through the apparatus to a printed circuit board ("PCB") to which the apparatus is connected for further limiting electromagnetic coupling of signals produced by the amplifier circuit with signals produced by another amplifier circuit proximate the first amplifier circuit.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

As previously noted, a transmit VGA circuit may be designed to interface between an RF-DAC and a power amplifier to provide amplification and power control over octave bandwidths. As will be described hereinbelow, in some embodiments, the active components of the amplifier may be realized as a monolithic SiGe integrated circuit combined with an organic laminate-based transmission line structure. The laminate structure may include passive components such as line-based structures, as well as lumped circuit element components, such as resistors, capacitors, and inductors, and may be realized in a manner that provides extremely high isolation between signal channels.

In particular, a balanced amplifier configuration with quadrature hybrid structures at the input and output enables excellent wideband return loss over octave bandwidths. Such a configuration also increases the Output Third Order Intercept ("OIP3") and the Output 1 dB Compression Point ("OP1 dB") by 3 dB due to the power combining at the output. The quadrature hybrid structures, as well as an input balun, are realized on the laminate structure, and amplifiers, analog attenuator ("VVAs") and digital attenuators ("DSAs") blocks are realized on a semiconductor (e.g., SiGe) die, for example. A custom flip-chip-on-laminate package is used with copper pillars that enable low inductance grounds and allow for better thermal management with the heat flowing through the copper pillars down to copper-filled vias in the laminate rather than through the die. In particular, the copper pillars on the semiconductor die allow grounds to be connected from the metal layers to the laminate after the die has been flipped. Shielding is used on-laminate in order to meet a challenging 65 dB channel-to-channel isolation requirement for a dual-channel device.

Figure 1A:
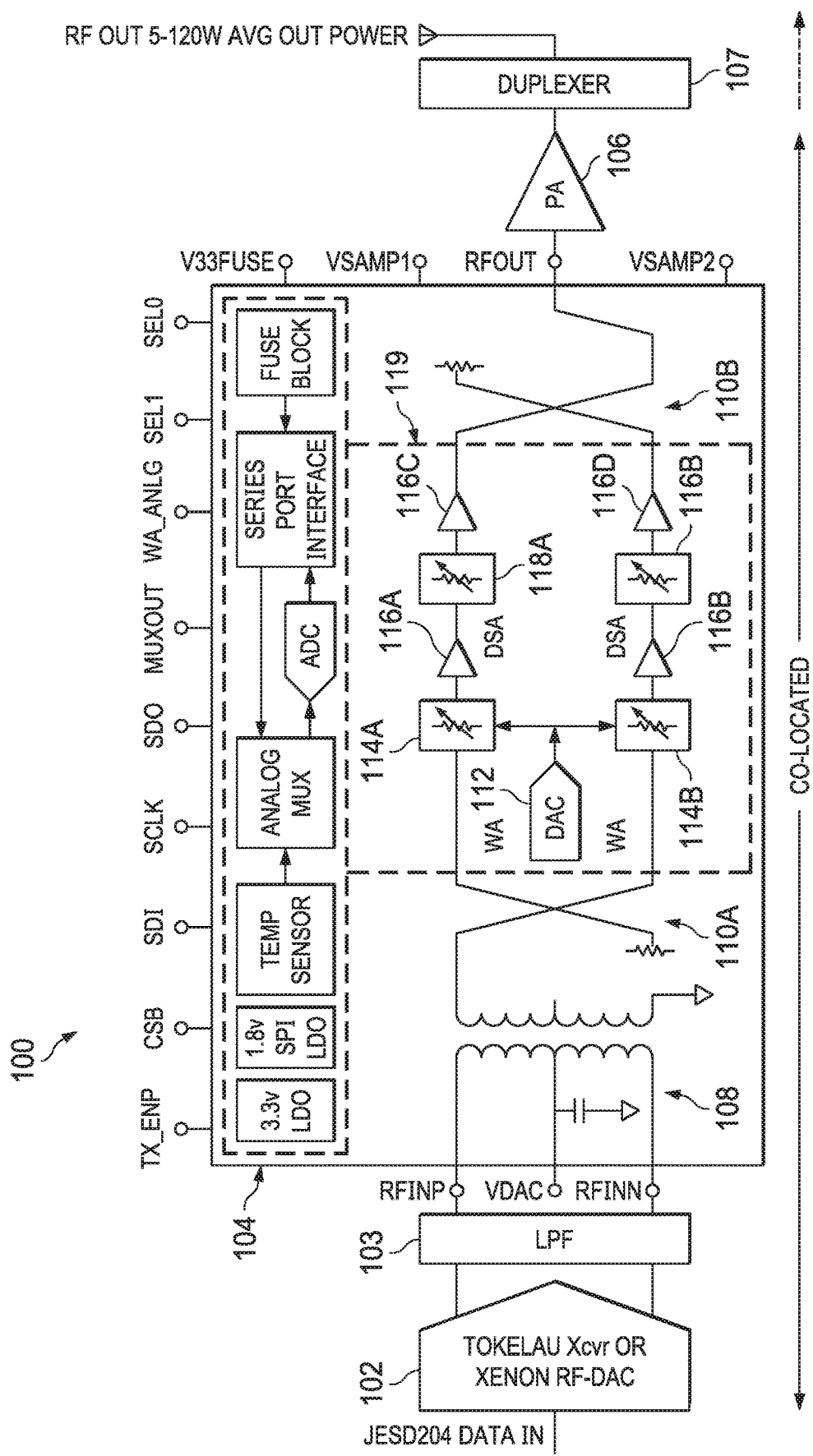
FIG. 1A is a simplified block diagram illustrating circuit including a high-performance VGA employing laminate transmission line structures in accordance with embodiments described herein.

Referring now to FIG. 1A, illustrated therein is a simplified block diagram illustrating a circuit 100 including a high-performance VGA employing laminate transmission line structures in accordance with embodiments described herein. As shown in FIG. 1A, the circuit 100 includes a transceiver or RF-DAC 102, a low pass filter ("LPF") 103 connected to receive an output of the RF-DAC 102, a high-performance VGA 104 connected to receive an output of the LPF 103, and a power amplifier ("PA") 106 connected to receive an output of the VGA 104. The output of the PA 106 may drive a duplexer 107. As further shown in FIG. 1A, the VGA 104 includes a balun 108, pair of quadrature hybrids 110A, 110B, a DAC 112, a pair of VVAs 114A, 114B, a plurality of amplifiers 116A-116D, and a pair of DSAs 118A, 118B. In accordance with features of embodiments described herein, and as described in greater detail below, the passive elements of VGA 104 (i.e., the balun 108 and quadrature hybrids 110A, 110B) are integrated into a metal laminate, which in one embodiment comprises six metal layers, while the active components of VGA 104 (e.g., the VVAs 114A, 114B, amplifiers 116A-116D, and DSAs 118A, 118B) are integrated into a single semiconductor (e.g., SiGe) integrated circuit ("IC") chip, represented in FIG. 1A by a dashed box 119, within the metal laminate. In particular, the IC chip is flipped and the copper pillar grounds and inputs and outputs are connected to the top layer of the laminate. The VGA 104 may have an OIP3 of 42 dBm and a OP1 of 25 dBm. In addition, the VGA 104 may enable full octave operation with integrated quadrature hybrids 110A, 110B, and has a 50-ohm differential input ("RFINP," "RFINN") and a 50-ohm single-ended output ("RFOUT").

Figure 1B:
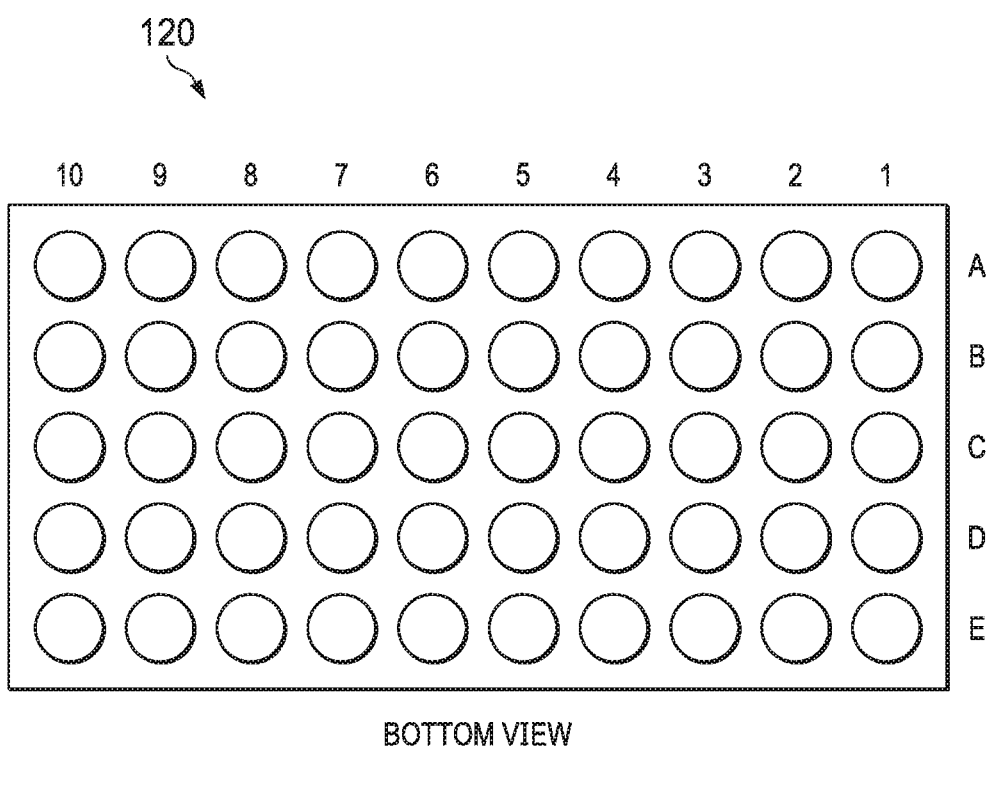
FIG. 1B is a simplified block diagram of an example ball grid array ("BGA") package for use in connection with the high-performance VGA of FIG. 1A.

As shown in FIG. 1A, the VGA 104 is a high-performance solution, with greater than 25 dBm of OP1 dB over a full octave bandwidth with excellent return loss and a total gain of 32 dB. The integrated quadrature hybrids 110A, 110B, provide wideband port match. Benefits of the VGA 104 include an integrated balun 108, optimization for output wideband return loss, and a simplified interface enabling direct connection to a DAC (e.g., RF-DAC 102). In one embodiment, as illustrated in FIG. 1B, the VGA 104 may be implemented as a 9 mm×4.5 mm 50 ball ball grid array ("BGA") package 120.

Figure 2A:
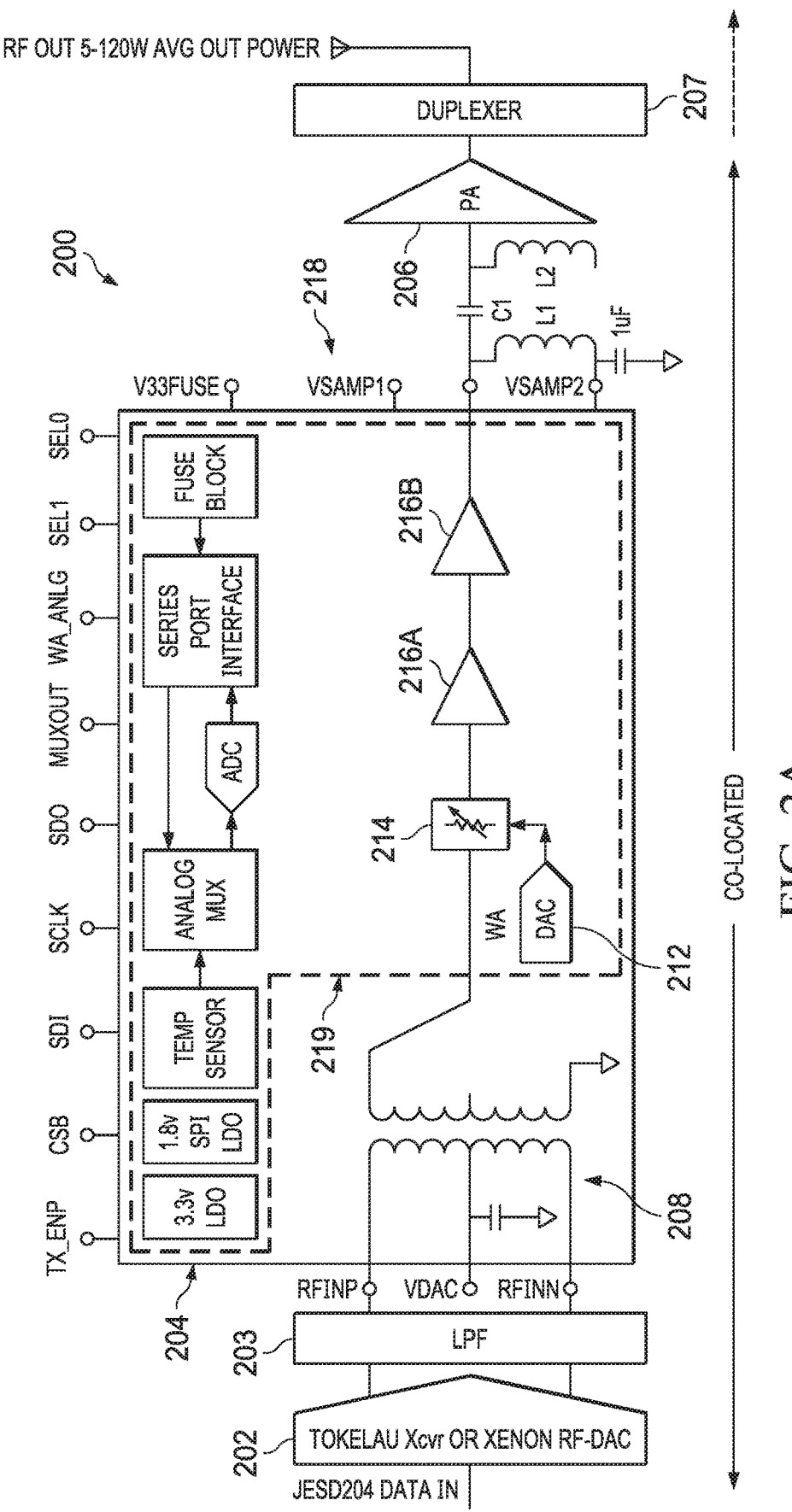
FIG. 2A is a simplified block diagram illustrating circuit including an alternative embodiment of a high-performance VGA employing laminate transmission line structures in accordance with embodiments described herein.

FIG. 2A is a simplified block diagram illustrating a circuit 200 including an alternative embodiment of a high-performance VGA employing laminate transmission line structures in accordance with embodiments described herein. Similar to the circuit 100, the circuit 200 includes a transceiver or RF-DAC 202, a low pass filter ("LPF") 203 connected to receive an output of the RF-DAC 202, a high-performance VGA 204 connected to receive an output of the LPF 203, and a power amplifier ("PA") 206 connected to receive an output of the VGA 204. The output of the PA 206 may drive a duplexer 207. As further shown in FIG. 2A, the VGA 104 includes a balun 208, DAC 212, a of VVA 214, and a pair of amplifiers 216A, 216B. In the embodiment shown in FIG. 2A, an output matching network ("OMN") 218 is provided at the output of the VGA 204, which is tied to an input of the PA 206.

Figure 2B:
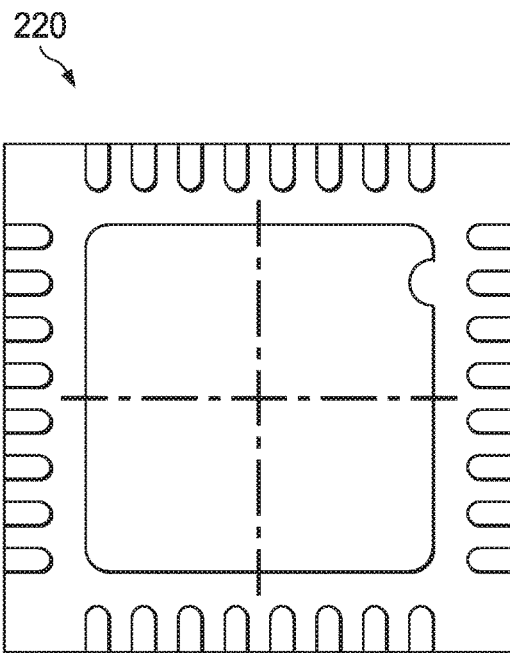
FIG. 2B is a simplified block diagram of an example land grid array ("LGA") package for use in connection with the high-performance VGA of FIG. 2A.

In accordance with features of embodiments described herein, and as described in greater detail below, the passive elements of VGA 204 (i.e., the balun 208 and quadrature hybrids 210) are integrated into a metal laminate, which in one embodiment comprises six metal layers, while the active components of VGA 204 (e.g., the VVA 214 and amplifiers 216A, 216B) are integrated onto a single semiconductor (e.g., SiGe) IC chip, represented in FIG. 2A by a dashed box 119, within the metal laminate structure as described above with reference to FIG. 1A. The VGA 204 enables ½ octave operation using the off-chip OMN and a 50-ohm differential input ("RFINP," "RFINN") and a 50-ohm single-ended output ("RFOUT"). In one embodiment, as illustrated in FIG. 2B, the VGA 204 may be implemented as a 5 mm×5 mm 25 pin land grid array ("LGA") package 220.

In certain embodiments, the balun 108 and the balun 208 are implemented as electromagnetically coupled baluns, due to their relatively small size, although other types of baluns, such as a transmission balun, may be used. The quadrature hybrids 110A, 110B, respectively split the VGA input signal into two 90-degrees-out-of-phase signals and combine the two out-of-phase signals back into an in-phase signal at the VGA output.

Figure 3:
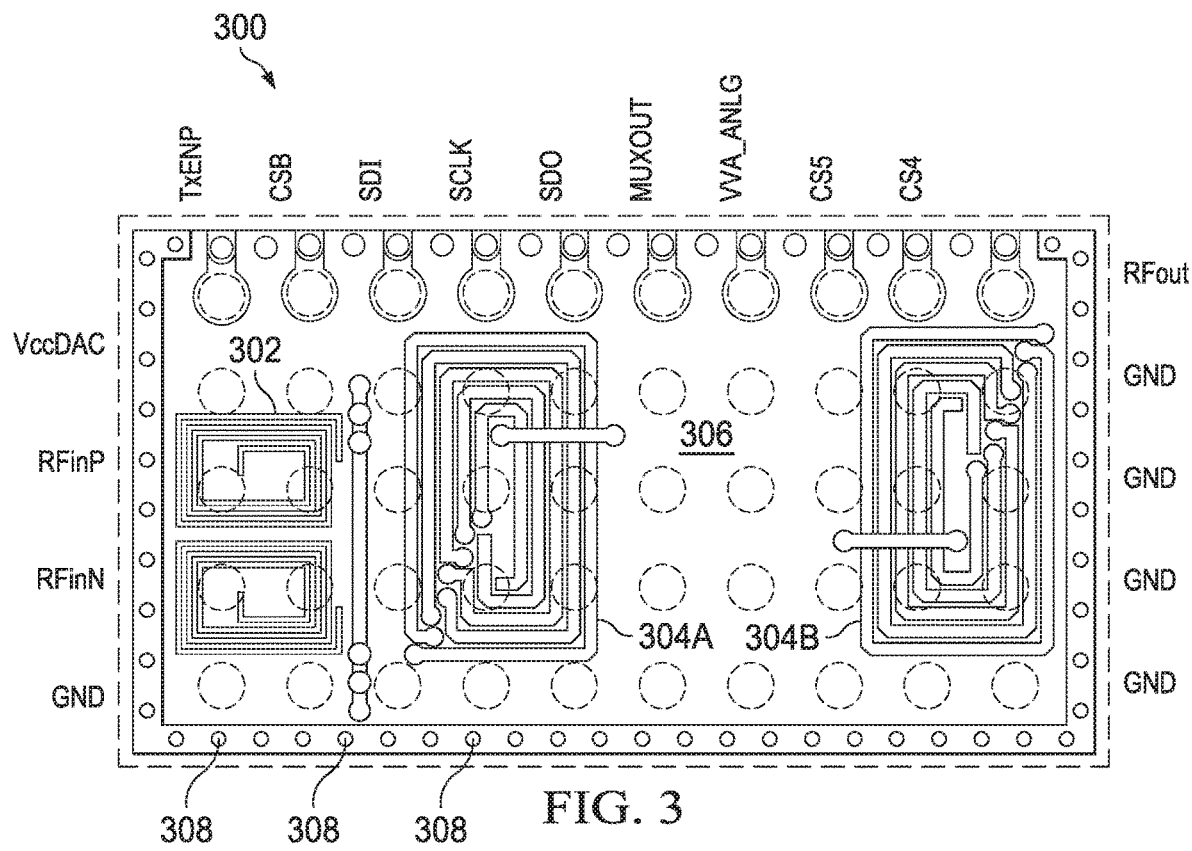
FIG. 3 illustrates an example layout of a metal laminate structure for a high-performance VGA employing laminate transmission line structures in accordance with embodiments described herein.

FIG. 3 illustrates an example layout 300 of a laminate structure 301 for a high-performance VGA employing laminate transmission line structures (e.g., VGA 104) in accordance with embodiments described herein. In certain embodiments, the laminate structure 301 comprises six layers of metal, the top layer of which is designed to shield the VGA. In particular, in one embodiment, the top, or shield, layer is comprised of copper. All of the passive and active components (e.g., balun, quadrature hybrids, IC chip) are disposed underneath the shield layer so that any electromagnetic coupling from these components to outside of the package is minimized, because the shield provides a low impedance path to ground.

As shown in FIG. 3, an area 302 designates a balun area and areas 304A and 304B designate two quadrature hybrid areas. An area 306 is reserved for placement of a die (or IC chip) comprising the active elements (e.g., the VVAs, DSAs, and amplifiers) of the VGA. As will be described in greater detail hereinbelow, in accordance with features of embodiments described herein, a plurality of ground vias, such as ground vias 308, are provided from the top metal layer to the bottom metal layer (and through the intervening metal layers) creating a "cage" for contributing to shielding and isolation of the VGA circuit. In particular, the ground vias act to shield any electromagnetically coupled signal by providing a low impedance path to ground, similar to the metal shield layer, thereby not permitting any signal to propagate outside of the package.

Figure 4:
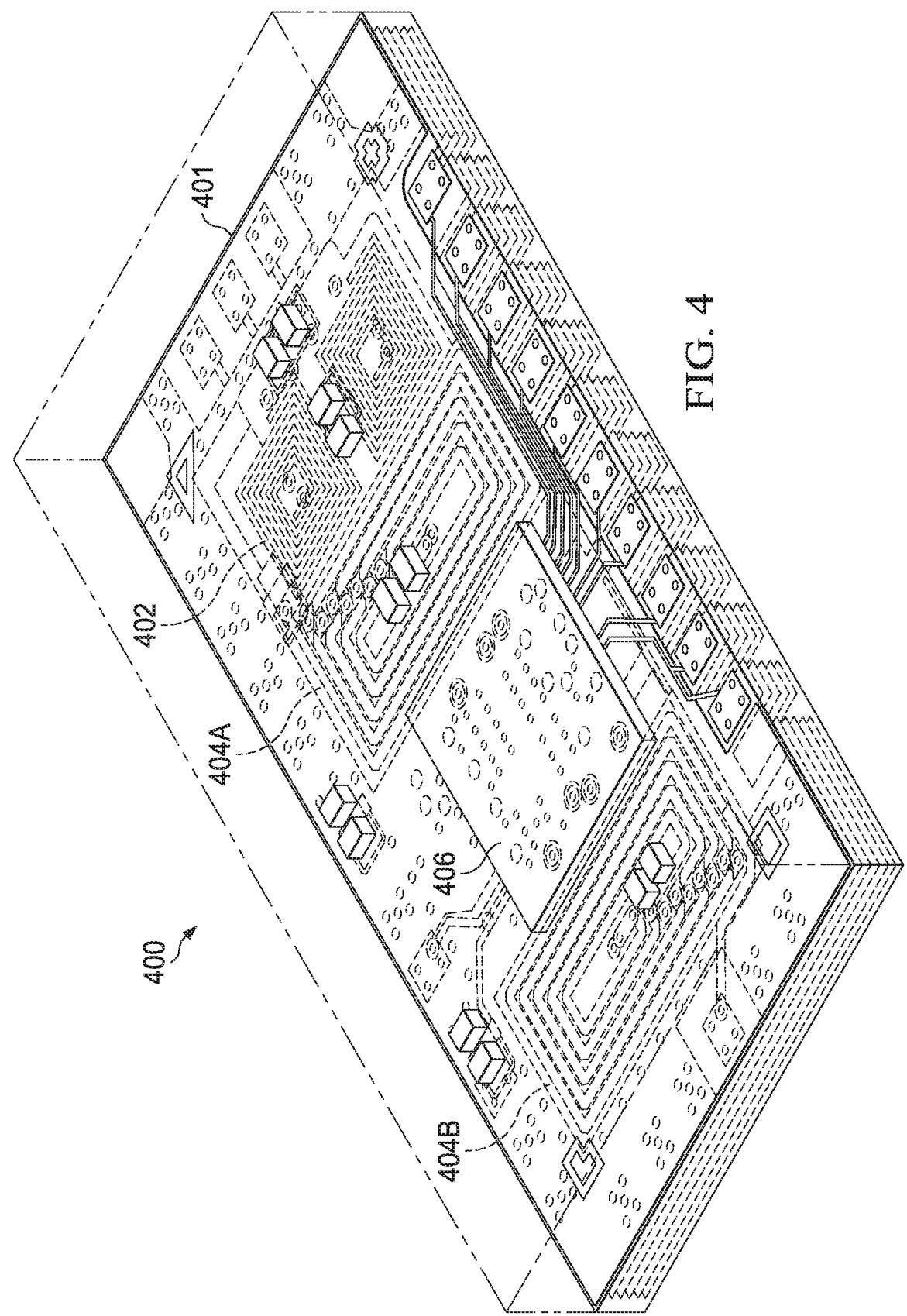
FIG. 4 illustrates a cutaway perspective view of a wafer package comprising a high-performance VGA employing laminate transmission line structures in accordance with embodiments described herein.

FIG. 4 illustrates a cutaway perspective view of a wafer package comprising a high-performance VGA 400 employing laminate transmission line structures in accordance with embodiments described herein. As shown in FIG. 4, the VGA 400 includes a laminate structure 401, which in certain embodiments comprises a six-layer metal laminate structure. In accordance with features of embodiments described herein, passive elements of the VGA 400, including a balun 402 and two quadrature hybrids 404A, 404B, are integrated into the laminate structure 401. Additionally, a semiconductor (e.g., SiGe) die 406 comprising active elements of the VGA 400, such as VVAs, DSAs, and amplifiers, is connected to the laminate structure 401.

Figure 5A:
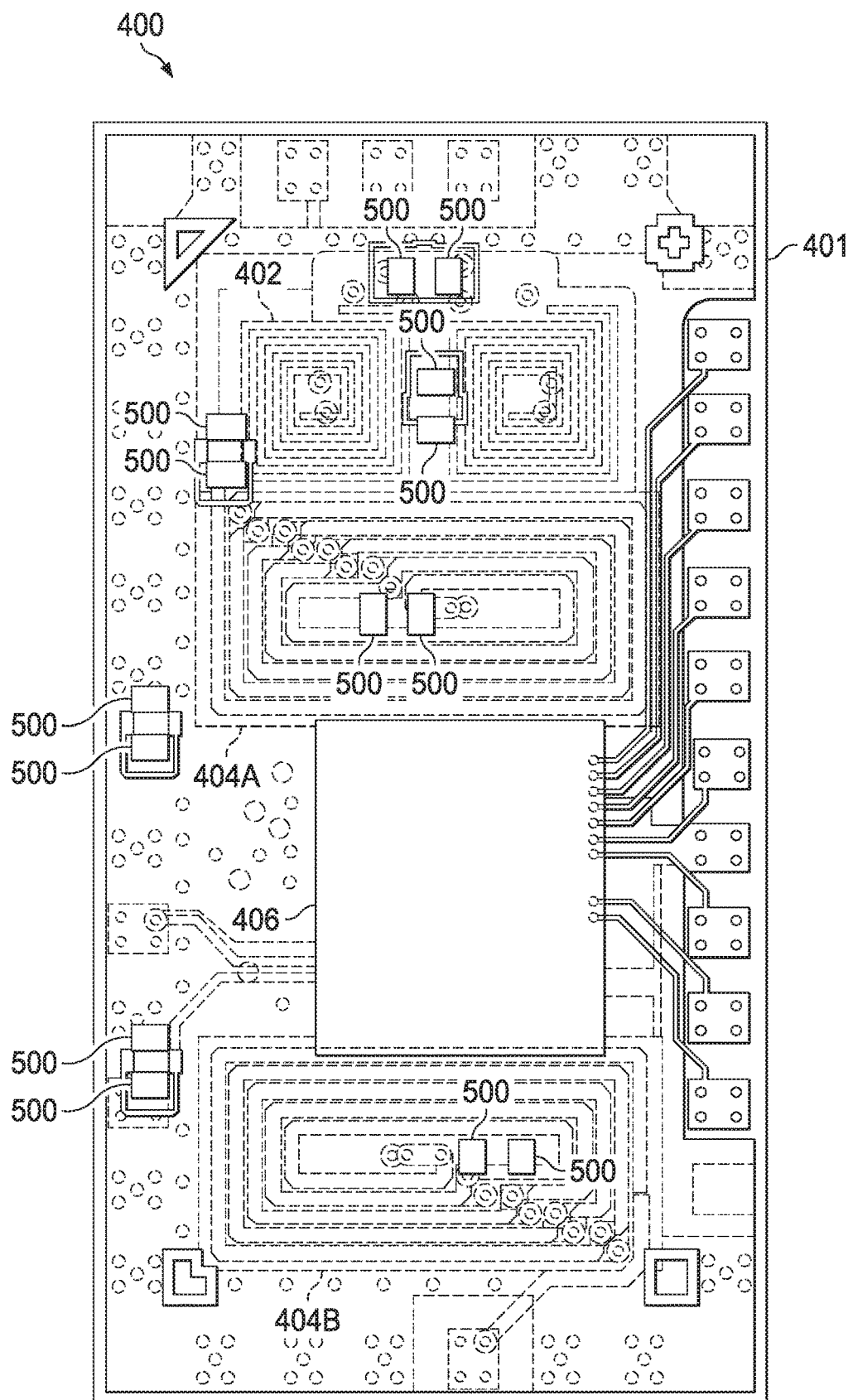
FIG. 5A illustrates a top plan view of the VGA of FIG. 4.
Figure 5B:
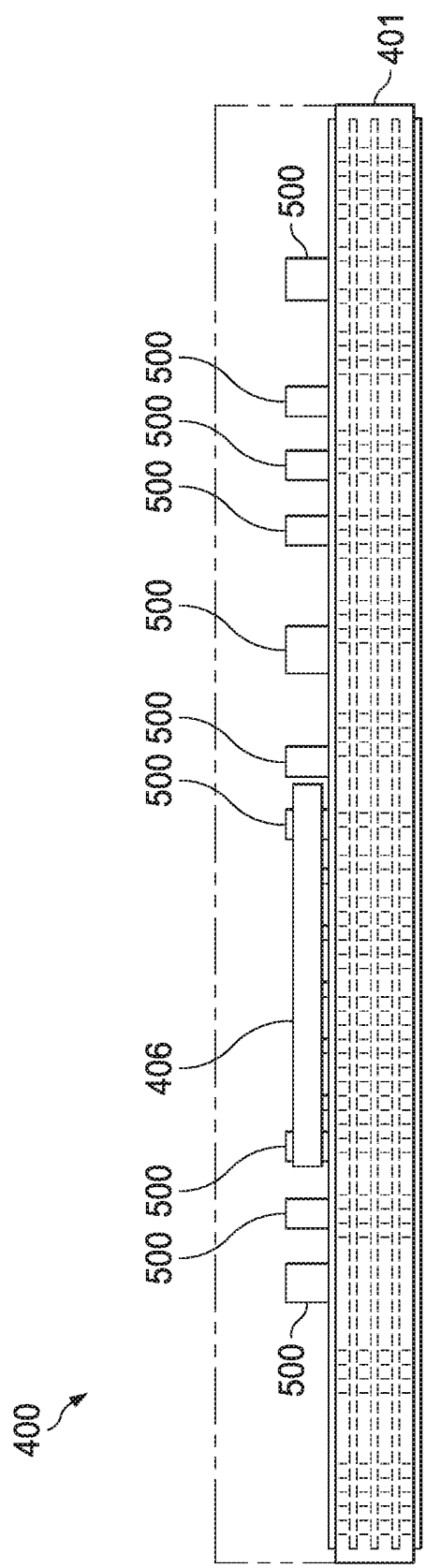
FIG. 5B illustrates a side plan view of the VGA of FIG. 4.
Figure 5C:
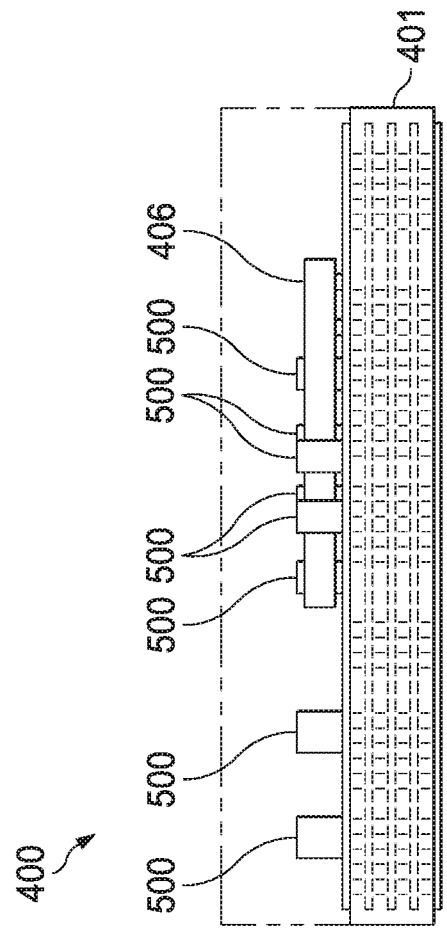
FIG. 5C illustrates an end plan view of the VGA of FIG. 4.
Figure 5D:
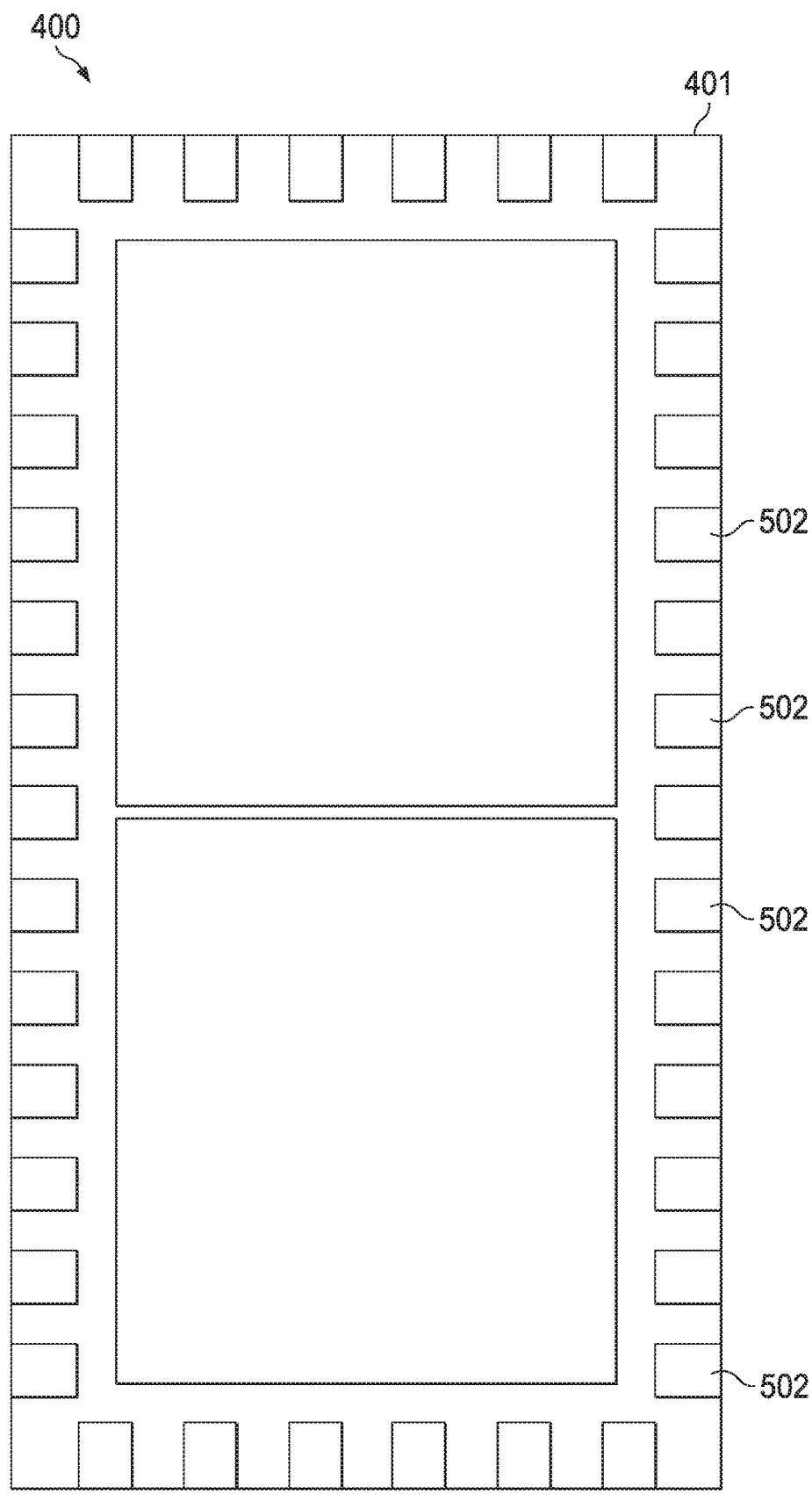
FIG. 5D illustrates a bottom plan view of the VGA of FIG. 4.

FIGS. 5A-5D are top, side, end, and bottom plan views, respectively, of the VGA 400. As best shown in FIGS. 5A-5C, the VGA 400 includes a plurality of surface mount resistors and capacitors, collectively designated by a reference numeral 500. In certain embodiments, surface mount resistors provide a 50-ohm termination of the input and output and provide for a desirable return loss, while surface mount capacitors help achieve active filtering and adequate return loss. As best shown in FIG. 5D, the VGA 400 also includes a plurality of input and output pads, such as pads 502.

Figure 6:
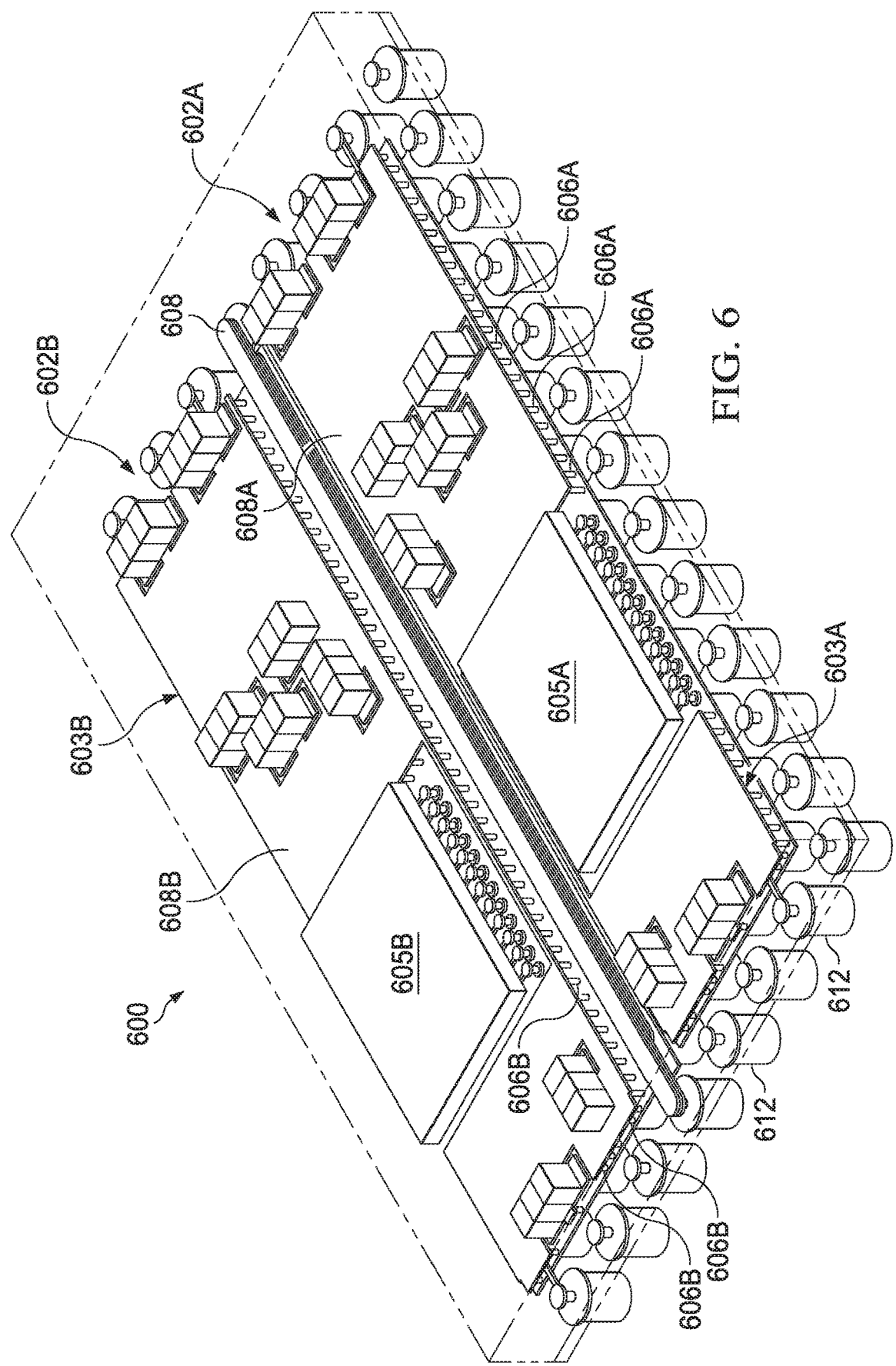
FIG. 6 illustrates a perspective cutaway view of a package comprising a dual-channel high-performance VGA package employing laminate transmission line structures in accordance with embodiments described herein.

Turning now to FIG. 6, illustrated therein is a perspective cutaway view of a package 600 comprising a dual-channel high-performance VGA product employing laminate transmission line structures in accordance with embodiments described herein. As shown in FIG. 6, two VGAs 602A, 602B, each of which is identical to the VGA 400 (FIG. 4) are disposed side-by-side within the package 600. In particular, VGA 602A comprises a metal laminate structure 603A into which transmission line structures including a balun (not shown) and quadrature hybrids (not shown) are integrated, and a semiconductor IC chip 605A into which active components (e.g., DSAs, VVAs, and amplifiers) are integrated. Similarly, VGA 602B comprises a metal laminate structure 603B into which transmission line structures including a balun (not shown) and quadrature hybrids (not shown) are integrated, and a semiconductor IC chip 605B into which active components (e.g., DSAs, VVAs, and amplifiers) are integrated. In accordance with features of embodiments described herein, each of the VGAs 602A, 602B, is individually "caged" by ground vias, represented by ground vias 606A (for shielding and isolating a channel comprising VGA 602A) and ground vias 606B (for shielding and isolating a channel comprising VGA 602B), as described above. Additionally, in accordance with features of embodiments described herein, a ground rail 608 is provided between the VGAs 602A, 602B, for isolating the corresponding channels from one another. In certain embodiments, the ground rail 608 comprises a stack of metal layers similar or identical to the layers of the laminate structure with via layers in between the metal layers. The metal layers are connected to ground through the package 600 to a printed circuit board to which the package is connected. This effectively provides a shield between the two VGA channels 602A, 602B, maximizing electromagnetic coupling from channel to channel and increasing isolation between the two channels.

In the embodiment illustrated in FIG. 6, the VGAs 602A, 602B, are mirror images of one another to provide a greater distance between the respective signal inputs and thereby contribute further channel isolation. As previously noted, the top metal layer of each VGA 602A, 602B, respectfully designated by reference numerals 608A, 608B, is designed to provide additional signal shielding and channel isolation, as described above. Ground vias, represented by ground vias 612, are provided and run from a top layer of a circuit board on which the package 600 is disposed to a bottom layer of the circuit board.

Advantages and features of embodiments described herein include isolation of components between channels to reduce interference using metal shielding provided by the top metal layer of the laminate structure, ground via "cages" provided within the laminate structure, and a ground rail disposed between individual VGA channels, all of which enable a multi-channel structure.

It should be noted that all of the specifications, dimensions, and relationships outlined herein (e.g., the number of elements, operations, steps, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system may be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and may accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) may include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and may accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An apparatus comprising:
   a semiconductor integrated circuit ("IC") chip comprising at least one active component for implementing an amplifier circuit; and
   a laminate structure comprising a plurality of metal layers, the laminate structure further comprising a plurality of passive components and transmission line-based structures;
   wherein the semiconductor IC chip is integrated with the laminate structure such that a top layer of the laminate structure comprises a shield over a top of the semiconductor IC chip and the passive components for limiting electromagnetic coupling of signals generated by the amplifier circuit beyond the laminate structure; and wherein the plurality of passive components comprises a balun connected to receive an output of a radio frequency digital-to-analog converter ("RF-DAC") and at least one quadrature hybrid connected between an output of the balun and an input of the semiconductor IC chip.

2. The apparatus of claim 1, wherein the top layer comprises copper.

3. The apparatus of claim 1, wherein the at least one active component comprises at least one of an operational amplifier, a digital attenuator ("DSA"), and an analog attenuator ("VVA").

4. The apparatus of claim 1, wherein the balun comprises a transmission line balun.

5. The apparatus of claim 1, wherein the plurality of passive components comprises at least one quadrature hybrid connected between an output of the semiconductor IC chip and an input of a power amplifier.

6. The apparatus of claim 1 further comprising a plurality of ground vias disposed around a periphery of the laminate structure from the top layer thereof to a bottom layer thereof for limiting electromagnetic coupling of signals produced by the amplifier circuit.

7. The apparatus of claim 1 further comprising a ground rail comprising a stack of metal layers connected to ground through the apparatus to a printed circuit board ("PCB") to which the apparatus is connected for further limiting electromagnetic coupling of signals produced by the amplifier circuit with signals produced by another amplifier circuit proximate the first amplifier circuit.

8. The apparatus of claim 7 wherein the metal layers comprising the ground rail are identical to the metal layers comprising the laminate structure.

9. The apparatus of claim 1, wherein the semiconductor IC chip comprises a silicon germanium ("SiGe") chip.

10. The apparatus of claim 1, wherein the semiconductor IC chip comprises copper pillars for enabling low inductance grounds.

11. A dual-channel amplification apparatus comprising:
a first semiconductor integrated circuit ("IC") chip comprising at least one first active component for implementing a first amplifier circuit associated with a first channel;
a second semiconductor IC chip comprising at least one second active component for implementing a second amplifier circuit associated with a second channel;
a first metal laminate structure comprising a first plurality of passive components and transmission line-based structures; and
a second metal laminate structure arranged parallel to the first metal laminate structure, the second metal laminate structure comprising a second plurality of passive components and transmission line-based structures;
wherein the first semiconductor IC chip is integrated with the first laminate structure such that a top layer of the first laminate structure comprises a first shield over a top of the first semiconductor IC chip and the first passive components for limiting electromagnetic coupling of signals comprising the first channel with signals comprising the second channel; and
wherein the second semiconductor IC chip is integrated with the second laminate structure such that a top layer of the second laminate structure comprises a shield over a top of the second semiconductor IC chip and the second passive components for limiting electromagnetic coupling of signals comprising the second channel with signals comprising the first channel.

12. The apparatus of claim 11, wherein the top layers of the first and second laminate structures comprises copper.

13. The apparatus of claim 11 further comprising a first plurality of ground vias disposed around a periphery of the first laminate structure from the top layer thereof to a bottom layer thereof and a second plurality of ground vias disposed around a periphery of the second laminate structure from the top layer thereof to a bottom layer thereof, the first and second plurality of ground vias for isolating the first channel from the second channel.

14. The apparatus of claim 11 further comprising a ground rail disposed between the first metal laminate structure and the second metal laminate structure, the ground rail comprising a stack of metal layers connected to ground for further limiting electromagnetic coupling of signals associated with the first channel and signals associated with the second channel.

15. The apparatus of claim 11 wherein the metal layers comprising the ground rail are identical to the metal layers comprising the laminate structure.

16. A variable gain amplifier ("VGA") circuit comprising:
a semiconductor integrated circuit ("IC") chip comprising at least one active component for implementing an amplifier circuit; and
a laminate structure comprising a plurality of metal layers, the laminate structure further comprising a plurality of passive components and transmission line-based structures; and
a plurality of ground vias disposed around a periphery of the laminate structure from the top layer thereof to a bottom layer thereof for limiting electromagnetic coupling of signals produced by the amplifier circuit;
wherein the semiconductor IC chip is integrated with the laminate structure such that a top layer of the laminate structure comprises a shield over a top of the semiconductor IC chip and the passive components for limiting electromagnetic coupling of signals generated by the amplifier circuit beyond the laminate structure.

17. The VGA circuit of claim 16 further comprising a ground rail comprising a stack of metal layers connected to ground through the apparatus to a printed circuit board ("PCB") to which the apparatus is connected for further limiting electromagnetic coupling of signals produced by the amplifier circuit with signals produced by another amplifier circuit proximate the first amplifier circuit.

18. The VGA circuit of claim 16 wherein the plurality of passive components comprises at least one quadrature hybrid connected to an input of the semiconductor IC chip.

19. The VGA circuit of claim 16 wherein the plurality of passive components comprises at least one quadrature hybrid connected to an output of the semiconductor IC chip.

* * * * *